United States Patent
Grajetzky

(10) Patent No.: US 9,977,417 B2
(45) Date of Patent: May 22, 2018

(54) METHOD FOR OPTIMIZING UTILIZATION OF PROGRAMMABLE LOGIC ELEMENTS IN CONTROL UNITS FOR VEHICLES

(71) Applicant: dSPACE digital signal processing and control engineering GmbH, Paderborn (DE)

(72) Inventor: Olaf Grajetzky, Herzebrock-Clarholz (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 477 days.

(21) Appl. No.: 14/602,571

(22) Filed: Jan. 22, 2015

(65) Prior Publication Data

US 2015/0205281 A1     Jul. 23, 2015

(30) Foreign Application Priority Data

Jan. 22, 2014   (EP) .................................... 14152109

(51) Int. Cl.
   *G06F 17/50*     (2006.01)
   *G06F 9/455*     (2018.01)
   (Continued)

(52) U.S. Cl.
   CPC .............. *G05B 19/05* (2013.01); *G05B 17/02* (2013.01); *G06F 17/5022* (2013.01)

(58) Field of Classification Search
   CPC .......... G06F 9/34; G06F 9/10; G06F 11/3664; G06F 17/2241; G06F 17/2264;
   (Continued)

(56) References Cited

U.S. PATENT DOCUMENTS

| | | | |
|---|---|---|---|
| 6,658,578 B1 * | 12/2003 | Laurenti | ................... G06F 5/01 712/244 |
| 8,301,815 B2 * | 10/2012 | Farrell | ................ G06F 9/30003 710/104 |

(Continued)

OTHER PUBLICATIONS

Yiannacouras et al., Fine-grain performance scaling of soft vector processors, Oct. 2009, 10 pages.*

(Continued)

*Primary Examiner* — Thuy Dao
(74) *Attorney, Agent, or Firm* — Muncy, Geissler, Olds & Lowe, P.C.

(57) ABSTRACT

A method and a system for optimizing utilization of a programmable logic element for use in an electronic control unit for vehicles, wherein the programmable logic element has a soft CPU and/or an unused remaining area. A plurality of model variants is generated that reproduce functionality of the control unit, and generate a plurality of soft CPU configurations with differing configuration scope, which occupy an area corresponding to the configuration scope of the programmable logic element, and execute processor-in-the-loop simulations for the plurality of model variants and/or soft CPU configurations after instantiation of the soft CPU corresponding to the soft CPU configuration on a programmable logic element. The profiling data acquired for the soft CPU during the PIL simulation is used with regard to the processing of the input signal for optimizing utilization of the programmable logic element.

7 Claims, 1 Drawing Sheet

(51) Int. Cl.
*G06F 13/00* (2006.01)
*G06F 15/76* (2006.01)
*G05B 19/05* (2006.01)
*G05B 17/02* (2006.01)

(58) Field of Classification Search
CPC ............ G06F 11/3447; G06F 11/3419; G06F 11/3476; G06F 17/5022; G06F 9/44505; G05B 19/05; G05B 17/02; G05B 17/5022
See application file for complete search history.

(56) References Cited

U.S. PATENT DOCUMENTS

| | | | | |
|---|---|---|---|---|
| 8,788,986 B2* | 7/2014 | Zink | ................... | G06F 11/3442 716/101 |
| 8,806,149 B2* | 8/2014 | Yamada | ............. | G06F 17/5022 711/154 |
| 8,868,396 B1* | 10/2014 | Shirazi | ............... | G06F 17/5022 703/13 |
| 8,886,512 B2* | 11/2014 | Kuya | ................. | G06F 17/5022 703/21 |
| 9,195,784 B2* | 11/2015 | Tseng | ................. | G06F 17/5022 |
| 9,292,631 B1* | 3/2016 | Koh | .................... | G06F 11/3668 |
| 9,317,331 B1* | 4/2016 | Koh | ...................... | G06F 9/5066 |
| 2007/0239936 A1* | 10/2007 | Gluhovsky | ......... | G06F 12/0802 711/118 |
| 2013/0080482 A1* | 3/2013 | Berkowitz | ............ | G06F 9/3004 707/803 |

OTHER PUBLICATIONS

Ihrig et al., Automated modeling and emulation of interconnect designs for many-core chip multiprocessors, Jun. 2010, 6 pages.*
Seo et al., "Coordinated Implementation and processing of a unified chassis control algorithm with multi-central processing unit," Proc. of Inst. of Mech. Eng., Part D: J. of Auto. Eng., vol. 224, No. 5, pp. 565-586 (May 1, 2010).
Bartosinski et al., "Integrated Environment for Embedded Control Systems Design," IEEE Int'l Parallel and Dist. Proc. Symp., pp. 1-8 (Mar. 1, 2007).
Jiang et al., "Processor-in-the-Loop Simulation, Real-Time Hardware-in-the-Loop Testing, and Hardware Validation of a Digitally-Controlled, Fuel-Cell Powered Battery-Charging Station," IEEE 35$^{th}$ Ann. Power Elec. Spec. Conf., vol. 3, pp. 2251-2257 (Jun. 20, 2004).
Hanselmann et al., "Production Quality Code Generation from Simulink Block Diagrams," Proc. of the 1999 IEEE Int'l Symp. on Comp. Aided Cont. Sys. Des., pp. 213-218 (Aug. 22, 1999).
Tong et al., "Soft-Core Processors for Embedded Systems," IEEE Int'l Conf. on Microelectronics, pp. 170-173 (Dec. 1, 2006).
MicroBlaze Processor Reference Guide Embedded Development Kit EDK 14.1 http://www.xilinx.com/support/documentation/sw_manuals/xilinx14_1/mb_ref_guide.pdf, pp. 1-254 (Apr. 24, 2012).
European Office Action for European Application No. 14152109.6 dated Feb. 15, 2018 with English translation.
Sheldon et al., "Application-Specific Customization of Parameterized FPGA Soft-Core Processors," IEEE/ACM Int'l Conf. on Computer-Aided Design, pp. 261-268 (Nov. 5, 2006).

* cited by examiner

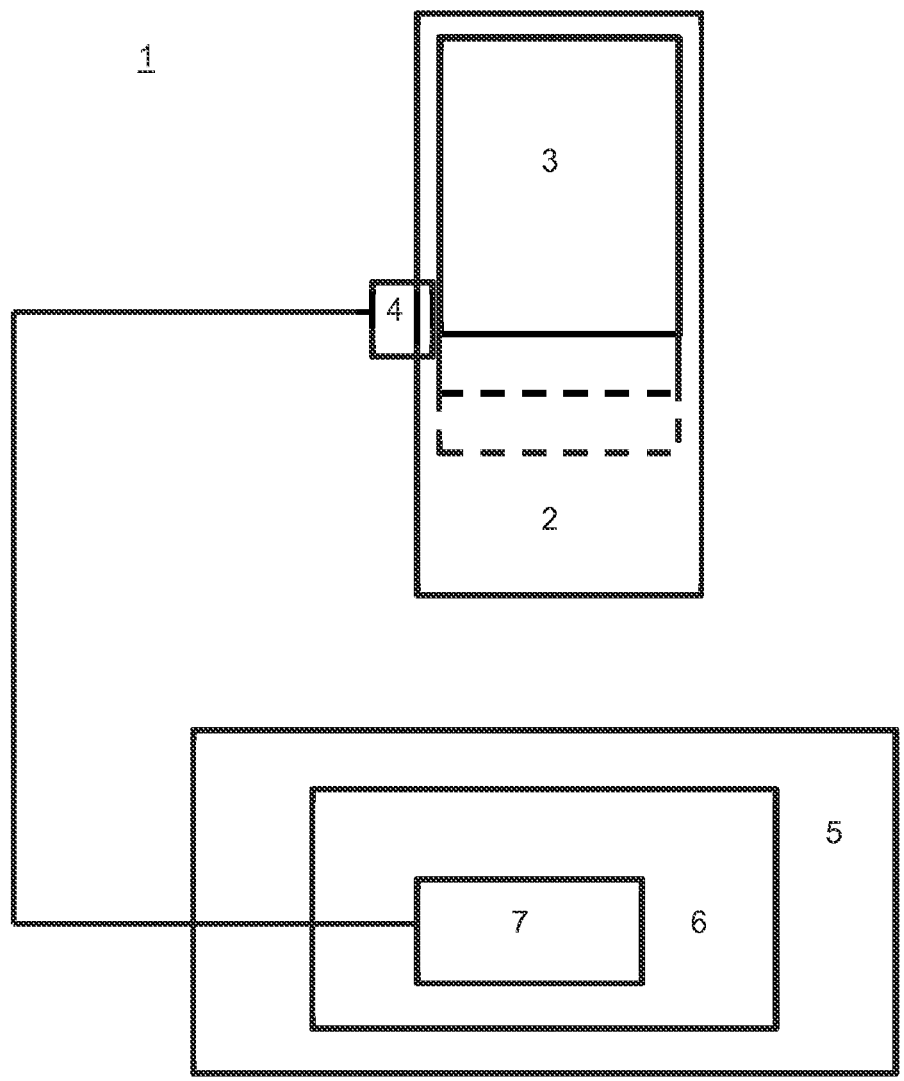

METHOD FOR OPTIMIZING UTILIZATION OF PROGRAMMABLE LOGIC ELEMENTS IN CONTROL UNITS FOR VEHICLES

This nonprovisional application claims priority to European Patent Application No. EP14152109.6, which was filed on Jan. 22, 2014, and which is herein incorporated by reference.

BACKGROUND OF THE INVENTION

Field of the Invention

The present invention relates to a method and a system for optimizing utilization of a programmable logic element for use in an electronic control unit for vehicles, wherein the programmable logic element has a soft CPU and/or an unused remaining area.

Description of the Background Art

The term electronic control unit is typically understood to mean a control system, for example a control unit in a motor vehicle. The electronic control unit can be used to measure, control, regulate, and/or calibrate vehicle components, for example. A vehicle can include, for example, watercraft, land vehicles, aircraft, spacecraft, and/or combinations thereof.

Conventional electronic control units for vehicles are implemented with techniques including the use of embedded systems, i.e. electronic computing units that are integrated in a technical context. A wide variety of CPU architectures are known for this purpose. An especially flexible platform in this context is highly integrated logic elements, e.g. field programmable gate arrays (FPGA), which not only reproduce various CPU architectures, but can also carry out parallel computing work well without a processor, through logic alone.

In this regard, the programmability of a logic element refers only secondarily to the specification of time sequences in the logic element. Primarily, this refers to the definition of fundamental functionalities of individual universal blocks in the programmable logic element and their interconnection to one another. Different circuits can be implemented in a programmable logic element through such programming of internal structures. These range from circuits of low complexity to highly complex circuits such as microprocessors. Since such a microprocessor is implemented/constructed exclusively through logic synthesis, it is called a soft CPU.

One example of such a soft CPU is the MicroBlaze™, the user documentation for which can be found at http://www.xilinx.com/support/documentation/sw_manuals/xilinx14_1/mb_ref guide.pdf. However, the present invention is in no way limited to the MicroBlaze™, but instead can be used with any desired soft CPU.

Depending on the desired configuration scope, soft CPUs such as the MicroBlaze™ have a configurable three- to five-stage pipeline, internal cache, an interrupt, a hardware-based multiplier, and optionally a hardware-based divider, a floating-point unit and special shift register units as well as multiple different buses that are provided for connecting to a wide range of peripherals and memory in a programmable logic element.

In an area-optimized variant of the MicroBlaze™ that uses a three-stage pipeline, the clock frequency is reduced in favor of a reduced demand for logic area. This contrasts with the performance-optimized version, in which a five-stage pipeline is used, permitting clock rates up to 210 MHz, but which accordingly also requires a larger area.

Moreover, the soft CPU can be configured such that core processor operations that are used infrequently and are resource-intensive to implement on the hardware side are added to the soft CPU (e.g. multiplication, division, or floating-point operations).

The amount of freely programmable area of the logic element occupied by the soft CPU is a function of the configuration of the soft CPU. If the amount of freely programmable chip area of a programmable logic is not exhausted by a required configuration—with or without a soft CPU—for producing a specific command set for executable computing operations, portions of the programmable logic element remain unused. Within the scope of the present invention, the remainder of freely programmable chip area is therefore referred to as the unused remaining area of the programmable logic element.

Moreover, it is part of current practice in the development of electronic control units to perform model-based simulations to test specific control and regulation mechanisms for an electronic control unit as a function of the applicable stage of development. In so doing, the desired control and regulation functions are first reproduced in a model. Based on the model-based design, program code or software is then generated that implements the previously modeled function in accordance with the appropriate model variant. At an early stage of development, first the model and then the software are tested in what is called a model- and software-in-the-loop (MIL/SIL) simulation method in order to detect differences between the behavior of the model code and the program code/software. If the program code is also executed on a real processor core, one speaks of a processor-in-the-loop (PIL) method or simulation. These PIL simulations permit early detection of bottlenecks, errors, and processes that cannot be implemented. PIL simulations and the profiling data produced thereby are known in the prior art, and are described in detail in, e.g., the documentation of applicable programs for model-based software design such as, e.g., TargetLink.

In later stages of development, parts of the hardware that have already been implemented (for example, a real electronic control unit for a vehicle as an embedded system) are tested for correct functionality with the aid of model-based, simulated input signals in what is called a hardware-in-the-loop (HIL) method.

As the stage of development advances, the expense of test equipment and test execution increases and the flexibility of the application of the systems to be tested decreases. For this reason, it is desirable to match model-based design for control units with regard to hardware-based boundary conditions/circumstances at an early stage.

SUMMARY OF THE INVENTION

It is therefore an object of the present invention to provide a method and system suitable for optimizing the utilization of a programmable logic element for use in an electronic control unit, wherein the programmable logic element has a soft CPU and/or an unused remaining area.

In an embodiment, the object is attained by a method of the initially mentioned type that comprises the steps of: generating a plurality of model variants that reproduce functionality of the control unit, wherein the model variants differ in the scope of computing operations to be executed by a soft CPU; generating a plurality of soft CPU configurations with differing configuration scope, which occupy an area corresponding to the configuration scope of the programmable logic element; executing processor-in-the-loop simulations for the plurality of model variants and/or soft CPU configurations, wherein the execution for each combination of model variant and soft CPU configuration includes: instantiation of the soft CPU corresponding to the soft CPU configuration on a programmable logic element located on a development circuit board that is connected to a computer, wherein a program code corresponding to the model variant is downloaded from the computer to the soft CPU; execution of a simulation program, wherein a signal to be processed according to the model variant of the soft CPU is simulated and is transmitted through an appropriate interface from the computer to the soft CPU programmed on the programmable logic element; Processing of the input signal by the soft CPU; acquisition and storage of profiling data of the soft CPU with regard to the processing of the input signal; and transmission of the processed signal and the profiling data from the programmable logic element to the computer.

The invention is also based on the realization that the area of the programmable logic element required by the soft CPU is based on the task, i.e., computing operation, to be carried out by the soft CPU. The more extensive the functionality that is provided by the soft CPU, the more area it will occupy on the programmable logic element. With the method according to the invention, the optimal configuration of a soft CPU can be ascertained from the standpoint of computing scope according to the model, computing precision, and the required configuration scope of the soft CPU and thus the area on the programmable logic element.

This is desirable in, for example, the following situations in the development of control units:

A programmable logic element is required in any case, and nonetheless has a remainder of freely programmable area that is still unused at present. The use of the remaining area as a soft CPU is possible here.

A programmable logic element with a soft CPU is required in any case and it is now necessary to decide whether and how much additional programmable area of the programmable logic element can/must be made available for the soft CPU.

Algorithmic functionalities are developed in a model-based manner and must be executed on the control unit. Execution on a microcontroller is ruled out, however, either because no microcontroller is present (but only a programmable logic element), or because no more resources on the microcontroller are free in order to execute the complete algorithmic functionality.

In situations such as those described above, it is desirable to efficiently use the remaining area of the programmable logic element to instantiate a soft CPU and the required hardware resources (memory etc.) on it so that program code generated in accordance with an applicable model of a control unit can be downloaded to the soft CPU and can accordingly be executed there. Alternatively, resources of a soft CPU that is already present may be utilized and/or extended in this way if applicable.

To ascertain optimal utilization, precise profiling data is obtained with the aid of the present invention through processor-in-the-loop simulations of the soft CPU as target platform, allowing conclusions to be drawn concerning the performance and efficiency of the soft CPU in processing the input signals in accordance with the downloaded program code. In this process, the configuration of the soft CPU can be varied in accordance with the available area on the programmable logic element and be combined with different variants of the program code to be executed by the soft CPU, wherein this code can differ both in the general scope of functionality as well as in the precision of computation of the computing operations. In addition, it is also possible to achieve an optimal utilization of the existing capacity of the soft CPU and the remaining area on the programmable logic element through suitable configuration of the model of the control unit via programs such as, e.g., TargetLink, by making changes directly to the model or with the aid of a data dictionary. TargetLink or an equivalent program can be used here to generate the program code such that it can be optimally executed on a (given) soft CPU. In this way, the following advantages are, for example, achieved with the present invention:

If a programmable logic element with available remaining area exists, then this can be used expediently and optimally through the invention in a very simple manner.

If a programmable logic element with soft CPU is present, its free computing capacity can be used expediently and optimally through the invention in a very simple manner.

In some cases one can dispense with microcontrollers if a programmable logic element is present that can compute this same functionality sufficiently efficiently and quickly.

In many cases (for different soft CPUs), it will be possible to reuse the PIL connection, i.e. the interface description for the soft CPUs.

In an embodiment of the present invention the profiling data include at least one of the quantities of utilization of the RAM and/or ROM memory, utilization of the stack, required execution time, or precision of the computing operation.

In an embodiment, the soft CPU configurations differ with regard to a use of fixed-point or floating-point operations.

In another embodiment, the soft CPU configurations differ with regard to cache for instructions and data and/or the length of the pipelines.

In another embodiment, the soft CPU configurations differ with regard to a use of basic arithmetic and logical operations.

In another embodiment, the steps further include: automatic selection of an optimal soft CPU configuration and the corresponding model variant in accordance with predefined criteria regarding the configuration scope of the soft CPU and the profiling data; and precisely fitting code generation of an appropriate control unit program code based on the selected model variant.

Instead of making available a selected number of model variants to choose from, all permutations can be run through automatically. An automatic selection of the optimal variant in accordance with predefined criteria can then likewise take place automatically based on the profiling data.

Another aspect of the present invention is a system for ascertaining an optimal utilization configuration of a programmable logic element for use in an electronic control unit for vehicles. The system can comprise a programmable logic element that is located on a development circuit board and has a soft CPU and/or an unused remaining area, and a computer for execution of a simulation program corresponding to a model variant of the electronic control unit, wherein the simulation program reproduces the functionality of the control unit and simulates input signals that are to be processed by a soft CPU on the programmable logic element. The system further can comprise a component for instantiating a soft CPU with a specific configuration scope on the programmable logic element, wherein the soft CPU occupies an area corresponding to the configuration scope of the programmable logic element, a component for downloading a program code corresponding to the model variant from the computer to the soft CPU; a component for transmitting an input signal generated during execution of the simulation program from the computer to the soft CPU instantiated on the programmable logic element for processing, a component for acquisition of profiling data of the soft CPU with regard to the processing of the input signal; and a component for transmitting a computing result obtained by the soft CPU by processing the input signal, and the acquired profiling data, from the soft CPU to the computer.

The component for downloading and transmitting data between the soft CPU instantiated on the programmable logic element and the computer that serves as the host PC for the simulation can be implemented by serial and/or Ethernet interfaces for mutual data exchange, for example. Hence, a simulation program on the computer can output the input signals corresponding to the model variant for the control unit to the programmable logic element on the development circuit board, in particular to the instantiated soft CPU. After execution by the soft CPU of the relevant program steps of the program code implemented on the soft CPU, profiling data acquired in the process is sent back to the host PC through the interface in addition to the computing result achieved, which is returned to the simulation program for further processing. The return of the computing result that was achieved to the simulation program results in a closed simulation loop that includes a path algorithm on the host PC and the model-based generated program code executed on the soft CPU. The component of the programmable logic element required for the bidirectional transmission of the input and result signals can likewise be used for transmission of the profiling data that were previously ascertained for the soft CPU during the processing of the input signal according to the model variant and have, if applicable, been buffered.

In this design, the logic element may have an unused remaining area. The soft CPU configuration here defines the scope of the required hardware resources as well as the scope of the instructions that can be processed by the soft CPU. The system can test different model variants of the control unit for the same soft CPU configuration, or else can test one model variant on different soft CPU configurations, wherein an adaptation of the corresponding soft CPU configuration may be necessary in this regard and a possible remaining area of the programmable logic element can be used for additional caches and pipelines as well as an extension of the instruction set. In this design, the configuration of the interface between the programmable logic element located on the development circuit board and the host PC can be used without change for different combinations of variants and soft CPU configurations.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 shows a systematic structure of an embodiment of the system according to the invention.

DETAILED DESCRIPTION

An aspect of the present invention centers on the application of processor-in-the-loop (PIL) simulations on a "soft CPU" as target platform (instead of a physical microcontroller as target hardware), wherein the soft CPU is instantiated on a programmable logic element. Profiling data can be obtained in the PIL simulations that provide insight into the utilization, performance, and efficiency of the soft CPU when executing program code implemented on the soft CPU. The program code to be executed in this case is determined by an underlying model of the control unit that reproduces the functionality of an electronic control unit and on the basis of which the program code to be executed by the soft CPU can be automatically generated by programs such as, e.g., TargetLink, in accordance with the relevant model-based design. By varying the soft CPU configuration and/or the model of the control unit, and thus the program code to be executed by the soft CPU, an optimal configuration of the soft CPU and/or an optimization of the model-based program code, or an optimal combination of the two, can be identified. The optimization process can also run in both directions.

On the one hand, different soft CPU configurations with differing configuration scope are instantiated on the programmable logic element; on the other hand, the functional scope of the model-based program code generated and implemented on the soft CPU can be varied.

In other words, not only is the configuration of a soft CPU optimized for a fixed model of a control unit, but the model of the control unit or the program code based on the model and to be executed later by the control unit can be varied as well in order to permit comprehensive optimal utilization of the available freely programmable area of the programmable logic element and of a soft CPU instantiated thereon and corresponding hardware resources (memory, pipelines, etc.). The optimally configured soft CPU thus ascertained is then instantiated later on the programmable logic element of a control unit and executes the program code generated from the model-based design.

The model design can be varied with TargetLink through changes in the model and/or in the TargetLink data dictionary. The optimization can thus take place as a tradeoff of performance versus precision versus freely programmable area of the programmable logic element.

FIG. 1 schematically shows a preferred embodiment of the system 1 according to the invention, in which a host PC 5 is connected to a programmable development logic element 2 located on a development circuit board either serially and/or via Ethernet. Instantiated on the programmable logic element is a soft CPU that of course occupies an area of the programmable logic element in accordance with the desired configuration scope. The interface 4 to the programmable development logic element can be described in VHDL, for example. The system thus configured permits the execution of PIL simulations with the soft CPU as target platform.

The sequence of a PIL simulation in this system is as follows:

A path model (as vehicle with environment) is simulated on the host PC 5. The modeling here can be performed with the use of programs 6 such as Matlab/Simulink, which make it possible to generate complete code (C and VHDL) from the model for microprocessors, computers, and programmable logic elements with the aid of suitable tools. Together with an additional program section 7—called the S-function here—the path model forms a closed control loop. The S-function 7 functions here as a placeholder for the model of the control unit that actually belongs in this location. It thus serves as a communications interface of the control loop to the soft CPU 3. The latter is instantiated according to a specific soft CPU configuration on a programmable development logic element 2 together with additional logic required to make the programmable development logic element into a PIL target platform. To this end, a connection to a host PC 5 must be implemented, e.g., through a serial or Ethernet connection. In addition, logic must be provided in order to record the necessary profiling data such as utilization of RAM, utilization of ROM, utilization of the stack, or even the execution time in carrying out the PIL simulation. The generic portions of a soft CPU for processing profiling data instantiated on the development logic element and also the connection to the host PC 5 can be reused in every project/test.

The program code generated in accordance with the model variant is loaded onto the soft CPU 3. The S-function 7 transmits a set of input signals to the soft CPU 3, where a control algorithm is executed in accordance with the implemented computing steps. The result of the control algorithm is returned to the S-function 7. In response to the computing result received, the S-function 7 in turn supplies new input signals for the next cycle.

In addition to the computing result, profiling data are also transmitted to the host PC. These data allow conclusions to be drawn concerning the performance of the soft CPU in executing the computing steps.

The PIL simulations are carried out for different model variants and/or soft CPU configuration with differing configuration scope, and the corresponding profiling data are ascertained in each case. Different configurations of the soft CPU and of the TargetLink model can be run in parallel or sequentially. When the simulations are run with different soft CPU configurations and/or model variants, a balance between the two opposing requirements must be found:

RAM/ROM/stack or the computing performance resulting from the soft CPU configuration must be sized adequately for the given soft CPU configuration in order to be able to compute the functionality on the soft CPU.

The soft CPU including the above resources must fit in the remaining area of the actual programmable logic element of the control unit, or the algorithm to be calculated must be executable in real time in the remaining free computing capacity of the soft CPU.

Finally, after multiple runs of the PIL simulations for different soft CPU configurations with differing configuration scope and/or model variants for the control unit, the soft CPU that optimally balances the above opposing requirements is instantiated on the programmable logic element of the control unit or in a remaining area on the programmable logic element, and the corresponding program code is executed there. The profiling data acquired in each case serves as a basis for evaluation in this process. The weighting of the requirements can depend on the individual case. For example, the method and system can be used to determine whether a specific process can be computed in real time and with the required precision solely by a programmable logic element, and thus whether it is possible to dispense with a microcontroller.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for optimizing utilization of a programmable logic element in an electronic control unit for vehicles, the programmable logic element comprising a soft CPU and/or an unused remaining area, the method comprising:
   generating a number of model variants that reproduce functionality of the control unit, the model variants differing in scope of computing operations to be executed by the soft CPU;
   generating a number of soft CPU configurations with differing configuration scopes, each soft CPU configuration occupying an area corresponding to a configuration scope on the programmable logic element;
   executing processor-in-the-loop simulations for different combinations of the number of model variants and the number of soft CPU configurations, the execution for each combination of model variant and soft CPU configuration includes:
      determination of a number of individual universal blocks in the programmable logic elements to be occupied for use by the soft CPU according to the soft CPU configuration;
      instantiation of the soft CPU corresponding to the soft CPU configurations on the programmable logic elements located on a development circuit board that is connected to a computer, wherein a program code corresponding to the model variant is downloaded from the computer to the soft CPU; and
      execution of a simulation program, wherein an input signal to be processed according to the model variant is simulated and is transmitted through an appropriate interface from the computer to the soft CPU programmed on the programmable logic elements;
   processing the input signal by the soft CPU; and
   acquiring and storing profiling data of the soft CPU with regard to the processing of the input signal, wherein the profiling data includes at least one of quantities of utilization of a RAM and/or a ROM, utilization of a stack, required execution time, or precision of computing operation.

2. The method according to claim 1, wherein the soft CPU configurations differ with regard to a use of fixed-point or floating-point operations.

3. The method according to claim 1, wherein the soft CPU configurations differ with regard to cache for instructions and data and/or a length of pipelines.

4. The method according to claim 1, wherein the soft CPU configurations differ with regard to a use of basic arithmetic and logical operations.

5. The method according to claim 1, wherein the method further comprises automatically selecting an optimal soft CPU configuration and a corresponding model variant in accordance with predefined criteria regarding the configuration scope of the soft CPU and the profiling data; and precisely fitting code generation of an appropriate control unit program code based on a selected model variant.

6. A system for ascertaining an optimal utilization configuration of a programmable logic element for use in an electronic control unit for vehicles, the system comprising:
   a programmable logic element that is arranged on a development circuit board and has a soft CPU and/or an unused remaining area;
   a computer for determining a number of universal blocks in programmable logic elements to be occupied for use by the soft CPU and for execution of a simulation program corresponding to a model variant that reproduces functionality of a control unit, the simulation program reproducing the functionality of the control unit based on the model variant, the simulation program simulating input signals that are to be processed by the soft CPU on the programmable logic element;

an instantiation component instantiating the soft CPU corresponding to a number of soft CPU configurations with differing specific configuration scopes on the programmable logic element, the soft CPU occupying an area corresponding to the configuration scopes on the programmable logic element;

a downloading component downloading a program code corresponding to the model variant from the computer to the soft CPU;

an input signal transmission component transmitting an input signal generated during execution of the simulation program from the computer to the soft CPU instantiated on the programmable logic element for processing;

a profile data acquisition component acquiring profiling data of the soft CPU with regard to the processing of the input signal; and a profile data transmission component transmitting the acquired profiling data from the soft CPU to the computer, wherein the profiling data includes at least one of quantities of utilization of a RAM and/or a ROM, utilization of a stack, required execution time, or precision of computing operation.

7. A method for optimizing utilization of a programmable logic element in an electronic control unit for vehicles, the programmable logic element comprising a soft CPU and/or an unused remaining area, the method comprising:

generating a plurality of model variants that reproduce functionality of the control unit, the model variants differing in scope of computing operations to be executed by the soft CPU;

generating a plurality of soft CPU configurations with differing configuration scope, which occupy an area corresponding to a configuration scope of the programmable logic element;

executing processor-in-the-loop simulations for different combinations of the plurality of model variants and/or soft CPU configurations, the execution for each combination of model variant and soft CPU configuration includes:

instantiation of soft CPU corresponding to the soft CPU configuration on the programmable logic element located on a development circuit board that is connected to a computer, wherein a program code corresponding to the model variant is downloaded from the computer to the soft CPU;

execution of a simulation program, wherein a signal to be processed according to the model variant of the soft CPU is simulated and is transmitted through an appropriate interface from the computer to the soft CPU programmed on the programmable logic element;

processing an input signal by the soft CPU;

acquiring and storing profiling data of the soft CPU with regard to the processing of the input signal; and automatically selecting an optimal soft CPU configuration and the corresponding model variant in accordance with predefined criteria regarding the configuration scope of the soft CPU and the profiling data; and precisely fitting code generation of an appropriate control unit program code based on the selected model variant, wherein the automatically selecting is based on the followings: utilization of a RAM, utilization of a ROM, utilization of a stack, required execution time, and precision of the computing operation.

* * * * *